(12) United States Patent
Im et al.

(10) Patent No.: US 9,548,712 B2
(45) Date of Patent: Jan. 17, 2017

(54) APPARATUS AND METHOD FOR CONTROLLING VOLUME IN PORTABLE TERMINAL

(75) Inventors: Byung-Jai Im, Seoul (KR);
Kyoung-Man Lim, Gyeonggi-do (KR);
Jung-Hoon Sok, Gyeonggi-do (KR);
Hyoung-Sang Cho, Seoul (KR);
Jin-Young Huh, Gyeonggi-do (KR);
Sei-Hwa Park, Gyeonggi-do (KR)

(73) Assignee: Samsung Electronics Co., Ltd., Samsung-ro, Yeongtong-gu, Suwon-si, Gyeonggi-do (KR)

(*) Notice: Subject to any disclaimer, the term of this patent is extended or adjusted under 35 U.S.C. 154(b) by 808 days.

(21) Appl. No.: 12/702,431

(22) Filed: Feb. 9, 2010

(65) Prior Publication Data

US 2010/0226511 A1 Sep. 9, 2010

(30) Foreign Application Priority Data

Mar. 4, 2009 (KR) .................. 10-2009-0018497

(51) Int. Cl.
*H03G 3/00* (2006.01)
*H03G 3/32* (2006.01)
*H03G 3/20* (2006.01)

(52) U.S. Cl.
CPC . *H03G 3/32* (2013.01); *H03G 3/20* (2013.01)

(58) Field of Classification Search
CPC .......... H03G 3/001; H03G 3/002; H03G 3/00;
H03G 3/04; H03G 3/3005; H03G 3/3089;
H03G 3/32; H03G 7/007; H03G 1/0088;
H03G 1/02; H03G 5/165
USPC ............ 381/56, 74, 104–109; 700/94; 482/8
See application file for complete search history.

(56) References Cited

U.S. PATENT DOCUMENTS

| | | | |
|---|---|---|---|
| 5,290,964 A * | 3/1994 | Hiyoshi et al. | 84/600 |
| 6,853,850 B2 * | 2/2005 | Shim et al. | 455/550.1 |
| 7,179,984 B2 * | 2/2007 | Nishitani et al. | 84/723 |
| 7,183,480 B2 * | 2/2007 | Nishitani et al. | 84/615 |
| 7,544,880 B2 * | 6/2009 | Takai et al. | 84/612 |
| 7,711,316 B2 * | 5/2010 | Bae | 455/3.06 |
| 8,817,993 B2 * | 8/2014 | Hsu et al. | 381/57 |
| 2009/0002147 A1* | 1/2009 | Bloebaum et al. | 340/466 |

FOREIGN PATENT DOCUMENTS

| | | |
|---|---|---|
| JP | 2007-295518 A | 11/2007 |
| JP | 2008-306242 A | 12/2008 |

* cited by examiner

*Primary Examiner* — Xu Mei
(74) *Attorney, Agent, or Firm* — Cha & Reiter, LLC.

(57) ABSTRACT

An apparatus and a method for controlling a volume in a mobile terminal are provided. The apparatus includes a motion detector and a controller. The motion detector outputs motion information from a user's movement. The controller determines the user's activity from the motion information output from the motion detector, and determines an appropriate output volume level responsive to the activity.

19 Claims, 2 Drawing Sheets

APPARATUS AND METHOD FOR CONTROLLING VOLUME IN PORTABLE TERMINAL

CLAIM OF PRIORITY

This application claims the benefit of the earlier patent application, entitled "APPARATUS AND METHOD FOR CONTROLLING VOLUME IN PORTABLE TERMINAL", filed in the Korean Intellectual Property Office on Mar. 4, 2009 and assigned Serial No. 10-2009-0018497, the contents of which are incorporated by reference in its entirety, herein.

BACKGROUND OF THE INVENTION

1. Field of the Invention

The present invention relates to a mobile terminal that can detect a user's movement. More particularly, the present invention relates to an apparatus and a method for controlling a volume of a mobile terminal to variably control an output volume suitable for activity depending on a user's movement.

2. Description of the Related Art

Today, various types of portable terminals such as cellular phones provide various functions to meet well-being trends in addition to traditional multimedia functions, which include music reproduction, moving image reproduction, Digital Multimedia Broadcasting (DMB) viewing, etc. More particularly, as an interest in health of people grew, various mobile terminals having a health-related function are competitively brought to the market. For example, there is a terminal mounted on a human body for measuring a user's exercise amount and in turn displaying an exercise effect.

Therefore, occasionally, a user may exercise while listening to music output from a mobile terminal via an earphone connected to the mobile terminal. Of course, the user may talk with a counterpart using the earphone during an exercise. However, when the user transitions to more intense exercise, music that has been reproduced at a previously set volume may not be heard. For example, when a user walks slowly and then suddenly runs, the user cannot properly listen to the music at a previously set volume due to elevated noise level associated with the running. Therefore, the user has an inconvenience of having to stop the exercise for a momentarily and resume, or try adjust the volume during the run.

SUMMARY OF THE INVENTION

The present invention provides an apparatus and a method for controlling a volume of a mobile terminal that overcome the inconvenience stated above, by automatically controlling a volume output during an exercise.

An exemplary aspect of the present invention is to provide an apparatus and a method for controlling a volume of a mobile terminal which automatically control an output volume level with consideration of a user's motion activity.

In accordance with an aspect of the present invention, an apparatus for controlling a volume in a mobile terminal includes a motion detector for outputting motion information from a user's movement, and a controller for determining the user's activity from the motion information output from the motion detector, and determining an appropriate output volume responsive to the activity.

In accordance with another aspect of the present invention, a method for controlling a volume in a mobile terminal includes obtaining motion information from a user's movement, determining the user's activity from the obtained motion information, and determining an output volume level proportional or appropriate to the determined activity.

Other exemplary aspects, advantages and salient features of the invention will become apparent to a person of ordinary skill in the art from the following detailed description, which, taken in conjunction with the annexed drawings, discloses exemplary embodiments of the invention in more detail.

BRIEF DESCRIPTION OF THE DRAWINGS

The above features and advantages of certain exemplary embodiments of the present invention will be more apparent to a person of ordinary skill in the art from the following detailed description taken in conjunction with the accompanying drawings, in which.

Throughout the drawings, like reference numerals will be understood to refer to like parts, components and structures.

DETAILED DESCRIPTION OF THE INVENTION

The following description, with reference to the accompanying drawings, is provided to assist a person of ordinary skill in the art with a comprehensive understanding of exemplary embodiments of the invention. The description includes various specific details to assist in that understanding but these details are to be regarded as merely exemplary. Accordingly, those of ordinary skill in the art will recognize that various changes and modifications of the exemplary embodiments described herein can be made without departing from the spirit of the invention and the scope of the appended claims. Also, descriptions of well-known functions and constructions may be omitted for clarity and simplicity so as not to obscure appreciation of the present invention by a person of ordinary skill with such well-known functions and constructions.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purposes only and not for the purpose of limiting the invention as defined by the appended claims.

It is to be understood that the singular forms "a", "an", and "the" include plural references unless the context clearly dictates otherwise. Thus, for example, reference to "a component surface" typically includes reference to one or more of such surfaces.

By the term "substantially" typically means that the recited characteristic, parameter, or value need not be achieved exactly, but that deviations or variations, including for example, tolerances, measurement error, measurement accuracy limitations and other factors known to those skilled in the art, and may occur in amounts that do not preclude the effect the characteristic was intended to provide.

Preferred exemplary embodiments of the present invention will be described below with reference to the accompanying drawings. Exemplary embodiments of the present invention provide an earphone device outputting sound in accordance with audio signals received from terminals. In particular, the present invention provides an apparatus and method for an earphone device that controls a terminal communicating with the earphone device according to the use or non-use of the earphone device.

Figure 1:
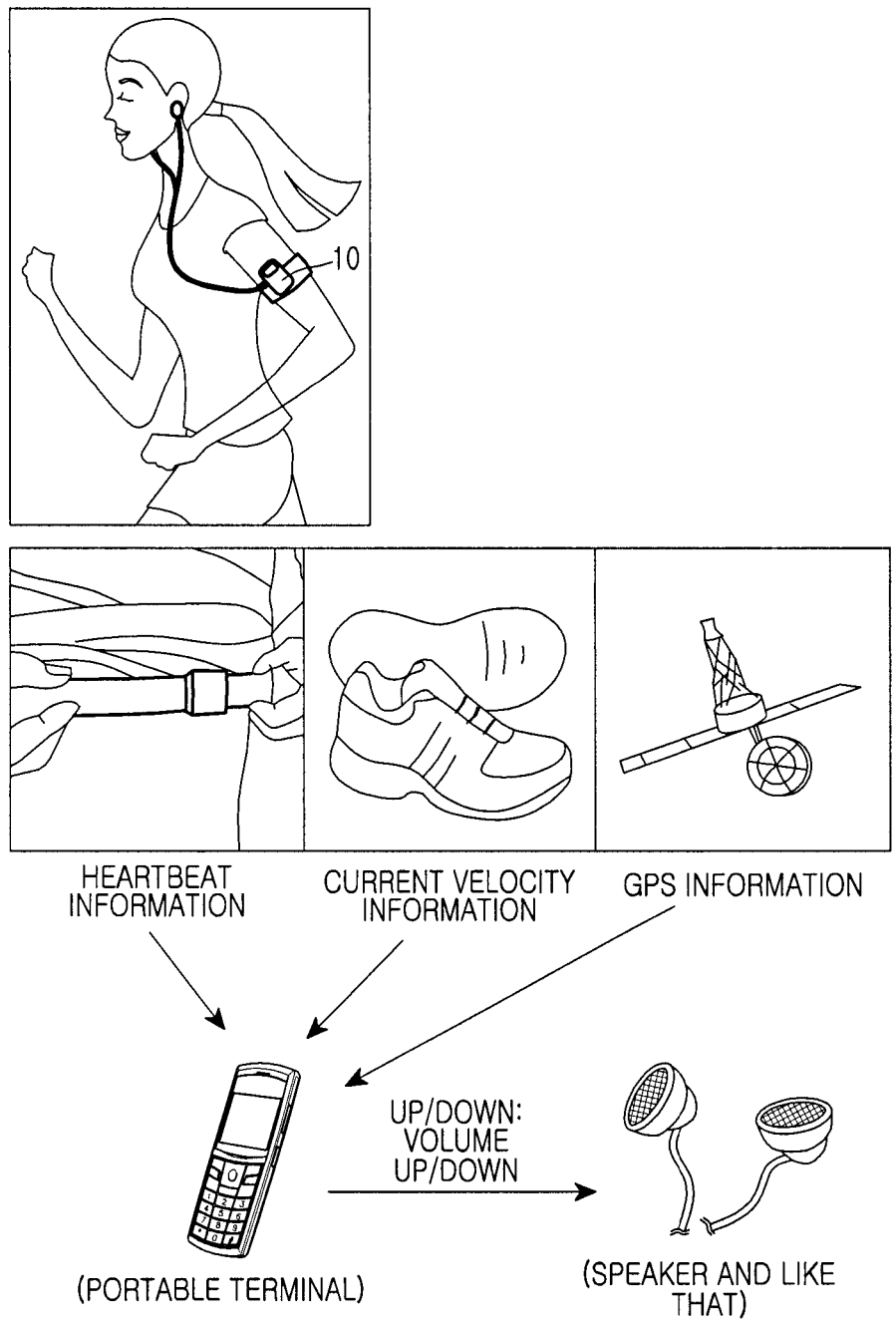
FIG. 1 is a view illustrating an example of a mobile terminal in use according to an exemplary embodiment of the present invention.

Exemplary embodiments of the present invention provide a mobile terminal that can detect a user's motion, and more particularly, a technique for variably controlling an output volume suitable for a specific activity of a user's motion. The activity denotes motion strength (activity). That is, according to an exemplary embodiment of the present invention, a volume can be selectively controlled in proportion to a motion's strength. Generally, when a numerical value of a user's movement velocity, heartbeat, etc. is increased, it may be determined that the user's activity has been elevated. FIG. 1 is a view illustrating an example of a mobile terminal in use according to an exemplary embodiment of the present invention. The mobile terminal 10 can reproduce sounds of a Motion Picture Expert Group Audio Layer-3 (MP3) player, another mobile terminal, wireless communication tone, etc.

Referring now to FIG. 1, the mobile terminal 10 may be mounted onto a user's relevant body portion to obtain the user's motion information, and determine an output volume corresponding to the obtained motion information. In addition, the mobile terminal 10 may determine a current motion state from the obtained motion information, and determine an output volume corresponding to the determined motion state. Although the mobile terminal is strapped to a jogger's arm for illustrative purposes, it should be noted that the mobile terminal can be positioned other parts of the body. The mobile terminal 10 may include a detecting unit for obtaining the motion information from the user's motion. The detecting unit may be an acceleration sensor that can measure a movement velocity using acceleration information of X, Y, and Z coordinate axes corresponding to the user's motion. Alternatively, the mobile terminal 10 may include a Global Positioning System (GPS) receiver and measure the movement velocity of the user from GPS signals provided from GPS satellites. As a result, the mobile terminal 10 receives the motion information including movement velocity using the acceleration sensor and/or the GPS receiver.

In addition, the mobile terminal 10 may receive the motion information from at least one external unit mounted on the user's body portion. Referring to FIG. 1, the external unit may be a unit that measures the user's heartbeat. Note that the external unit may be mounted on the user's body portion such as a footwear, arm, etc. to provide a movement velocity corresponding to a relevant motion. Here, the mobile terminal 10 may receive the motion information from the external unit via wired communication or wireless communication (e.g., Bluetooth) with the external unit.

As shown, the mobile terminal 10 may receive the motion information from at least one external unit mounted on the user's body portion and/or from a detecting unit of the mobile terminal 10. Here, the GPS satellites may be classified into external units not mounted on the user's body portion. At this point, the mobile terminal 10 may obtain the motion information by communicating with the external unit via a wired line or wirelessly.

After receiving the motion information from the detecting unit and/or the external unit, the mobile terminal 10 considers all received information to determine the user's activity. That is, the mobile terminal 10 may determine the level of a user's activity by comparing stored reference values of a database. After that, the mobile terminal 10 controls a volume to an output volume corresponding to the determined size of the user's activity. An appropriate sound level is selectively controlled to correspond with the level of detected activity via an earphone in communication with the mobile terminal 10. In addition, the newly adjusted sound level may also be reproduced via a wireless ear set that can perform wireless communication, such as Bluetooth. For example, when a current heartbeat and movement velocity becomes higher than before, the mobile terminal 10 in turn increases an output volume by a predetermined amount. The activity may be subdivided into various steps depending on motion information such as the heartbeat, movement velocity, etc., and these subdivided activities may match with motion states such as 'walk', 'run', 'jump', etc. As a faster movement is detected, the level of sound output can be increased depending on these motion states.

Figure 2:
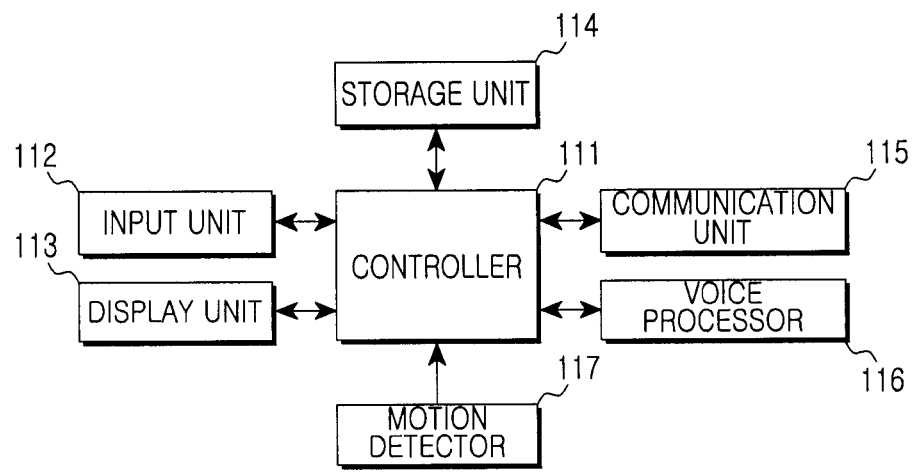
FIG. 2 is a block diagram illustrating a mobile terminal according to an exemplary embodiment of the present invention.

FIG. 2 is a block diagram illustrating a mobile terminal according to an exemplary embodiment of the present invention.

Referring now to FIG. 2, the mobile terminal 10 includes a controller 111, an input unit 112, a display unit 113, a storage unit 114, a communication unit 115, a voice processor 116, and a motion detector 117.

In operation, the controller 111 controls an overall operation of the mobile terminal 10, and determines a user's motion state to control an output volume.

The input unit 112 performs a relevant function on the controller 111, and more particularly, outputs an input signal for performing a volume control.

The display unit 113 displays an operation of a relevant function under control of the controller 111.

The storage unit 114 stores parameters for controlling the mobile terminal 10 and various information under control of the controller 111. More particularly, the storage unit 114 stores suitable volume values designated in advance according to degree of a user' activity. After determining the user's activity, the controller 111 controls an output volume corresponding to the activity with reference to the volume values stored in advance in the storage unit 113. However, since suitable received volume values depending on a user's activity may differ for each user, it can be updatable by a user. In this case, the controller 111 may control an interface for updating a suitable volume value corresponding to a relevant activity.

As described with reference to FIG. 1, the communication unit 115 allows the motion detector 117 to communicate with the external unit via a wired line or wirelessly in order to receive the motion information from the external unit.

The voice processor 116 receives a signal of a relevant output volume under control of the controller 111 and outputs the same to a relevant speaker.

The motion detector 117 detects motion information required for the controller 111 to determine a user's activity. As described above, the motion detector 117 may include a detecting unit such as an acceleration sensor for detecting a movement velocity, a GPS receiver, etc. In addition, the motion detector 117 may receive the motion information from an external unit mounted on the user's body portion, and provide the received motion information to the controller 111. The external unit may be a unit for measuring heartbeat, a unit for measuring a movement velocity that is known to those skilled in this art, etc.

Figure 3:
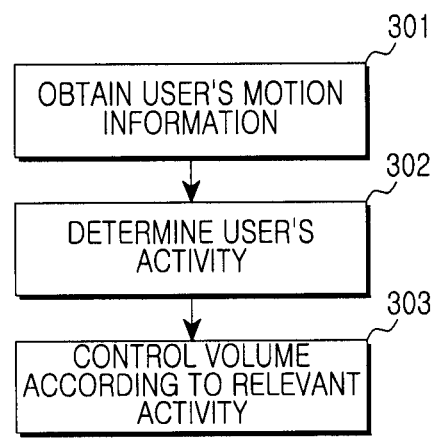
FIG. 3 is a flowchart illustrating a method for controlling a volume of a mobile terminal according to an exemplary embodiment of the present invention.

FIG. 3 is a flowchart illustrating a method for controlling a volume of a mobile terminal according to an exemplary embodiment of the present invention.

Referring now to FIG. 3, the controller 111 receives a user's motion information from the motion detector 117 in step 301.

The controller 111 determines the user's activity by applying the received motion information to a relevant algorithm in step 302. As described above, the activity may be subdivided into a plurality of steps.

The controller 111 determines an output volume by determining a volume value corresponding to the determined activity based on a database of the storage unit 113 in step 303.

Having thus described a preferred embodiment of adjusting the output volume of a mobile terminal during various stages of a user's activity, it should be apparent to those skilled in the art that the teachings of the present invention resolve inconvenience of being interrupted during an activity or exercise.

While the invention has been shown and described with reference to certain preferred embodiments thereof, it will be understood by those skilled in the art that various changes in form and details may be made therein without departing from the spirit and scope of the invention as defined by the appended claims and their equivalents.

What is claimed is:

1. An apparatus for controlling a volume level of audio from an audio source, comprising:
    a mobile terminal receiving the audio and outputting the audio to a speaker with a first volume level, the mobile terminal including:
        a housing;
        a motion detector in the housing configured to detect motion information comprising a movement velocity corresponding to a movement of the mobile terminal;
        a storage unit in the housing storing in advance a plurality of predetermined volume levels corresponding respectively to a plurality of predetermined strengths of activities with continuous motion; and
        a controller in the housing configured to perform determining a current strength of the current activity with continuous motion from the detected motion information, determining a second volume level of the plurality of predetermined volume levels corresponding to the current strength of the current activity with continuous motion, and determining an output volume level of the speaker by adjusting the first volume level of the audio with the second volume level corresponding to the current strength of the current activity with continuous motion.

2. The apparatus of claim 1, wherein the motion information further comprises a movement velocity corresponding to a heartbeat.

3. The apparatus of claim 1, wherein the motion detector comprises one or more detecting units configured to provide the motion information.

4. The apparatus of claim 3, wherein one of the detecting units comprises an acceleration sensor configured to provide the movement velocity as the motion information.

5. The apparatus of claim 3, wherein one of the detecting units receives a Global Positioning System (GPS) signal when a movement is detected and provides a corresponding movement velocity as the motion information.

6. The apparatus of claim 1, wherein each of the plurality of predetermined volume levels corresponding to each respective predetermined strength of the current activity is updatable.

7. The apparatus of claim 1, wherein the apparatus transfers the output volume level of the speaker via a wired line or wirelessly.

8. A method for controlling a volume level of audio from an audio source, the method comprising:
    mounting a housing of a mobile terminal;
    receiving the audio at the mobile terminal;
    outputting the audio from the mobile terminal to a speaker with a first volume level;
    storing in advance, in a storage unit in the housing, a plurality of predetermined volume levels corresponding respectively to a plurality of predetermined strengths of the activities with continuous motion;
    obtaining motion information comprising a movement velocity corresponding to a movement of the mobile terminal via at least one motion detector in the housing;
    determining, using a controller in the housing, a current strength of the current activity with continuous motion from the obtained motion information;
    determining, using the controller, a second volume level of the plurality of predetermined volume levels corresponding to the current strength of the current activity with continuous motion; and
    determining, using the controller, an output volume level of the speaker by adjusting the first volume level of the audio with the second volume level corresponding to the current strength of the current activity with continuous motion.

9. The method of claim 8, wherein the motion information further comprises a movement velocity corresponding to a heartbeat.

10. The method of claim 9, wherein the current activity is in proportion to the movement velocity and/or the heartbeat.

11. The method of claim 8, wherein the at least one motion detector is in communication with a Global Positioning System (GPS) signal.

12. The method of claim 8, wherein the at least one motion detector comprises an acceleration sensor for providing a movement velocity as the motion information.

13. The method of claim 8, wherein the mobile terminal transfers the output volume level of the speaker via a wired line or wirelessly.

14. A mobile terminal comprising:
    a motion detector configured to detect motion of the mobile terminal;
    a storage unit storing a plurality of predetermined volume levels corresponding respectively to a plurality of strengths of activities based on continuous motion;
    a controller configured to perform determining a current strength of a current activity from the detected motion information comprising a movement velocity corresponding to a movement of the mobile terminal, and determining, based on the current strength of the current activity with continuous motion, a volume level of an receiving unit to be corresponding to the current strength of the current activity when the receiving unit is coupled to the mobile terminal.

15. The terminal of claim 14, wherein the motion information further comprises a movement velocity corresponding to a heartbeat.

16. The terminal of claim 14, wherein the motion detector comprises one or more detecting units configured to provide the motion.

17. The terminal of claim 16, wherein one of the detecting units comprises an acceleration sensor configured to provide the movement velocity as the motion of the mobile terminal.

18. The terminal of claim 16, wherein one of the detecting units receives a Global Positioning System (GPS) signal when a movement is detected and provides a corresponding movement velocity as the motion of the mobile terminal.

19. The terminal of claim 14, wherein the terminal transfers the output volume level of a speaker via a wired line or wirelessly.

\* \* \* \* \*